United States Patent
Chen et al.

(10) Patent No.: US 7,492,015 B2
(45) Date of Patent: Feb. 17, 2009

(54) COMPLEMENTARY CARBON NANOTUBE TRIPLE GATE TECHNOLOGY

(75) Inventors: Jia Chen, Ossining, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 11/164,109

(22) Filed: Nov. 10, 2005

(65) Prior Publication Data

US 2007/0102747 A1    May 10, 2007

(51) Int. Cl.
  *H01L 27/092* (2006.01)
(52) U.S. Cl. ............ 257/369; 257/40; 257/E51.006; 257/E51.04; 977/742; 977/940
(58) Field of Classification Search ............ 257/40, 257/369, E51.006, E51.04; 977/742, 940
See application file for complete search history.

(56) References Cited

U.S. PATENT DOCUMENTS

| | | | |
|---|---|---|---|
| 6,890,780 B2 * | 5/2005 | Lee ............................. 438/23 |
| 6,891,227 B2 | 5/2005 | Appenzeller et al. |
| 7,084,507 B2 * | 8/2006 | Awano ....................... 257/773 |
| 7,105,851 B2 * | 9/2006 | Dubin ........................ 257/24 |
| 7,141,727 B1 * | 11/2006 | Appenzeller et al. .......... 257/20 |
| 7,170,120 B2 * | 1/2007 | Datta et al. ................. 257/288 |
| 7,180,107 B2 * | 2/2007 | Appenzeller et al. ........ 257/288 |
| 7,253,431 B2 * | 8/2007 | Afzali-Ardakani et al. .... 257/20 |
| 7,254,151 B2 * | 8/2007 | Lieber et al. ............. 372/44.01 |
| 7,345,307 B2 * | 3/2008 | Pan et al. .................... 257/57 |
| 7,378,715 B2 * | 5/2008 | Lee ........................... 257/419 |
| 7,427,541 B2 * | 9/2008 | Datta et al. ................. 438/178 |
| 2002/0173083 A1 * | 11/2002 | Avouris et al. ............. 438/129 |
| 2003/0089899 A1 | 5/2003 | Lieber et al. |
| 2003/0132461 A1 * | 7/2003 | Roesner et al. ............. 257/213 |
| 2003/0178617 A1 * | 9/2003 | Appenzeller et al. .......... 257/20 |
| 2004/0036128 A1 * | 2/2004 | Zhang et al. ................ 257/401 |
| 2004/0144972 A1 | 7/2004 | Dai et al. |
| 2004/0245527 A1 | 12/2004 | Tsukagoshi et al. |
| 2004/0253741 A1 | 12/2004 | Star et al. |
| 2005/0051805 A1 | 3/2005 | Kim et al. |
| 2005/0056825 A1 | 3/2005 | Bertin et al. |
| 2005/0156203 A1 | 7/2005 | Bae et al. |
| 2005/0224888 A1 * | 10/2005 | Graham et al. .............. 257/368 |

(Continued)

*Primary Examiner*—VanThu Nguyen
*Assistant Examiner*—Michael Lulis
(74) *Attorney, Agent, or Firm*—Gibb & Rahman, LLC; Richard M. Kotulak, Esq.

(57) ABSTRACT

Disclosed is a CNT technology that overcomes the intrinsic ambipolar properties of CNTFETs. One embodiment of the invention provides either a stable p-type CNTFET or a stable n-type CNTFET. Another embodiment of the invention provides a complementary CNT device. In order to overcome the ambipolar properties of a CNTFET, source/drain gates are introduced below the CNT opposite the source/drain electrodes. These source/drain gates are used to apply either a positive or negative voltage to the ends of the CNT so as to configure the corresponding FET as either an n-type or p-type CNTFET, respectively. Two adjacent CNTFETs, configured such that one is an n-type CNTFET and the other is a p-type CNTFET, can be incorporated into a complementary CNT device. In order to independently adjust threshold voltage of an individual CNTFET, a back gate can also be introduced below the CNT and, particularly, below the channel region of the CNT opposite the front gate. In this manner parasitic capacitances and resistances are minimized.

22 Claims, 5 Drawing Sheets

U.S. PATENT DOCUMENTS

2005/0250305 A1* 11/2005 Al-Rabadi ................... 438/614
2007/0275487 A1* 11/2007 Lee ............................. 438/22
2008/0150165 A1* 6/2008 Stumbo et al. .............. 257/784

* cited by examiner

US 7,492,015 B2

COMPLEMENTARY CARBON NANOTUBE TRIPLE GATE TECHNOLOGY

BACKGROUND OF THE INVENTION

1. Field of the Invention

The invention generally relates to carbon nanotube semiconductor devices, and, more particularly, to a carbon nanotube field effect transistor that is configured to overcome intrinsic ambipolar properties and to allow for threshold voltage adjustments and to complementary carbon nanotube devices that incorporate such transistors.

2. Description of the Related Art

A carbon nanotube (i.e., nanoscale hollow graphite tube) can, depending on its conformational geometry, exhibit either metallic or semiconductor properties. In recent years the use of semiconductor carbon nanotube (CNT) devices, such as CNT field effect transistors (CNTFETs), has been proposed to overcome scaling limits encountered by silicon semiconductor devices. Additionally, since semiconductor CNTs exhibit high transconductance, a desirable property for complementary devices, such as complementary inverters, complementary CNTFET circuitry which mimics complementary metal oxide semiconductor (CMOS) technology has been proposed. However, there are two basic barriers to doing so. First, CNTs form intrinsically ambipolar FETs due to the formation of Schottky-Barrier contacts at the junction of the source and drain electrodes and the CNT. Second, since the threshold voltage (Vt) of CNTFETs are not easily controlled via conventional means, such as doping of the channel, some means is required to adjust the threshold voltages to complementary CNTFETs-compatible values. Therefore, it would be advantageous to provide a CNTFET, and more particularly, a complementary CNT device incorporating carbon nanotube transistors that are configured to overcome intrinsic ambipolar properties and to allow for threshold voltage adjustments.

SUMMARY OF THE INVENTION

In view of the foregoing, disclosed herein is a carbon nanotube (CNT) technology that overcomes the intrinsic ambipolar properties of CNT field effect transistors (FETs) and optionally, allows for independent threshold adjustments. One embodiment of the invention provides either a stable p-type CNTFET or a stable n-type CNTFET. Another embodiment of the invention provides a complementary CNT device (e.g., a complementary CNT inverter) that incorporates both a stable p-type CNTFET and a stable n-type CNTFET, as described.

More particularly, an embodiment of the stable n-type CNTFET or p-type CNTFET of the invention comprises at least one carbon nanotube (CNT) having a first side, a second side and opposing ends. For illustration purposes, embodiments of the CNTFET of the invention are described herein using a single CNT. However, it is anticipated and illustrated in the accompanying figures, that the CNTFET of the invention may incorporate either a single CNT or multiple CNTs. Specifically, the CNT has a central channel region and source/drain electrodes on either side of the channel region (i.e., at the opposing ends). The source/drain electrodes contact the first side of the CNT at the opposing ends. The CNTFET structure further comprises a first gate (i.e., a front gate) for imparting a potential to the channel region of the CNT to render the CNTFET in a conducting or non-conducting state (i.e., turn on or off the FET), second gates (i.e., source/drain gates) for forcing the Fermi level of the opposing ends of the CNT to either the valence or the conduction bands so as to configure the CNTFET as either a p-FET or an n-FET, and optionally, a third gate (i.e., a back gate) for imparting a preselected potential to the channel region of the CNT to adjust the threshold voltage of the CNTFET. Each gate (i.e., the first gate, second gates and third gate) comprises a gate conductor (e.g., a doped polysilicon, tungsten silicide, or any other suitable conductive material) and a gate dielectric (e.g., silicon dioxide or any other suitable dielectric material).

The first gate is positioned on the first side of the CNT above the channel region and between the source/drain electrodes.

The second gates are positioned on the second side of the CNT opposite the source/drain electrodes. Specifically, second gates are positioned at each end of the CNT. As mentioned above, the second gates are adjusted to a preselected (either negative or positive) voltage in order to configure the CNTFET as either a p-FET or an n-FET, respectively. For example, a negative bias (i.e., a negative voltage) applied to the source/drain electrodes of the CNT(s) can promote the population of holes within the CNT, by pushing the Fermi level to the valence band and resulting in dominance of holes below the source/drain electrodes. The resulting structure acts as a p-FET. Alternatively, a positive bias (i.e., a positive voltage) applied to the source/drain electrodes of the CNT can promote the population of electrons within the CNT, by forcing the Fermi level to the conduction band and resulting in a dominance of electrons below the source/drain electrodes. The resulting structure acts as an n-FET. The second gates are formed such that there is a gap (i.e., a dielectric filled space) between the two second gates below the CNT. The gap between the two source/drain gates defines the area of the CNT that is not acted upon by the second gates and, thus, the size of this gap defines the channel region of the CNTFET. Additionally, the first and second gates can overlap to some degree (e.g., the first gate can be aligned above the gap and extend over a portion of the second gates) so as to optimize conduction in the carbon nanotube. Furthermore, the relative positioning of the first gate on the first side of the CNT and the second gates on the second side of the CNT minimizes parasitic capacitance between the second gates and the first gate and avoids parasitic resistance between the second gates and the source/drain electrodes.

Optionally, a third gate can be positioned on the second side of the CNT below the channel region. As mentioned above, the third gate can be biased to an additional preselected voltage to adjust the threshold voltage of the CNTFET. The third gate can be positioned closer to the CNT than the second gates to the extent that it does not obscure the effect of the second gates on the CNT in the vicinity of the source/drain electrodes. The third gate can also be positioned in the gap between the two second gates such that it is the same distance from the CNT as the second gates. However, the drive current of the CNTFET can be optimized by positioning the third gate below the gap such the gate dielectric of the third gate is thicker than that of both the first gate and the second gates. If the third gate is below the gap, then the size of the gap further defines the area of the carbon nanotube upon which the third gate can act (i.e., the area to which preselected potential can be imparted to adjust threshold voltage).

As mentioned above, another embodiment of the invention provides a complementary CNT device (e.g., a complementary inverter) that incorporates both a stable p-type CNTFET and a stable n-type CNTFET, as described above. More particularly, an embodiment of the complementary CNT device comprises two transistors (i.e., a first transistor and a second transistor). The first and second transistors each comprise at least one carbon nanotube (as described above), source/drain electrodes (as described above), a first gate (as describe above), second gates (as described above) and optionally, a third gate (as described above). As with the CNTFET of the invention, for illustration purposes, embodiments of the complementary CNT device of the invention are described using a single CNT in each of the first and second transistors. However, it is anticipated and illustrated in the accompanying figures, that the invention may incorporate either a single CNT or multiple CNTs in each of the first and second transistors. Adjacent transistors (i.e., the first and second transistors) can be incorporated into a complementary CNT device (e.g., a complementary CNT inverter) by configuring one of the transistors as an n-type CNTFET and the other as a p-type CNTFET. Specifically, a positive voltage applied to the opposing ends of the first transistor via the second gates configures the first transistor as a stable n-type transistor (see detailed discussion above). A negative voltage applied to the opposing ends of the second transistor via the second gates configures the second transistor as a stable p-type transistor (see detailed discussion above). Additionally, if third gates are positioned below the channel region of both of the first and second transistors (e.g., as described above), the third gates may be used to independently adjust the threshold voltages of the n-type and p-type CNTFETs, respectively, within the complementary CNT device.

Also, disclosed herein is a method of forming the CNTFET structures and complementary CNT device structure of the invention. More particularly, the following method steps provide for the formation of either a single CNTFET (p-type or n-type) or a complementary CNT device (with both a p-type and an n-type CNTFET).

The method comprises forming at least one transistor such that each transistor (e.g., a single transistor or multiple adjacent transistors) is formed with a front gate, source/drain gates, and optionally, a back gate. A preselected voltage can be applied to the front gate so as to impart a potential to the channel region of the CNT and, thereby, turn the CNTFET on or off. Another preselected voltage (e.g., a preselected negative or positive voltage) can be applied to the source/drain gates in order to force the Fermi level in the opposing ends of the CNT to the valence or conduction bands and, thereby, configure the CNTFET as either a p-FET or an n-FET, respectively. Optionally, an additional preselected voltage can be applied to the back gate so as to impart an additional preselected potential to the channel region to independently adjust the threshold voltage of the CNTFET. Each of the gate structures (i.e., the front gate, the source/drain gates and the back gate) are formed using conventional methods such that they each comprise a corresponding gate conductor (e.g., a doped polysilicon, tungsten silicide, or any other suitable conductive material) and a corresponding gate dielectric (e.g., silicon dioxide or any other suitable dielectric material) adjacent the CNT.

More particularly, at least one transistor is formed by optionally forming a back gate structure (e.g., on an insulator layer above a substrate). Source/drain gates are preferably formed above the back gate and separated by a gap such that the back gate is aligned below the gap. A carbon nanotube, having opposing ends and a channel region, is formed such that the source/drain gates are aligned below the opposing ends and such that the gap (and thus, the back gate) is below the channel region. Those skilled in the art will recognize that by forming the source/drain gates above the back gate, the back gate dielectric between the back gate and the carbon nanotube can be formed thicker than the source/drain gate dielectric between the second gates and the carbon nanotube in order to optimize drive current. Additionally, source/drain electrodes are formed above the carbon nanotube such that they contact the opposing ends of the carbon nanotube, opposite the source/drain gates. A front gate is also formed above the CNT. Specifically, a front gate is formed above the channel region between the source/drain electrodes. By aligning the front gate above the gap and extending the front gate over a portion of each of the source/drain gates conduction in the carbon nanotube can be optimized. The at least one transistor can be configured into either a p-FET or an n-FET by imparting a negative voltage or positive potential, respectively, to the opposing ends of the CNT opposite the source/drain electrodes. If at least two adjacent transistors are formed, those transistors can be incorporated into a complementary CNT inverter by configuring one of the two adjacent transistors as a stable p-type transistor and another of said two a stable n-type transistor.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
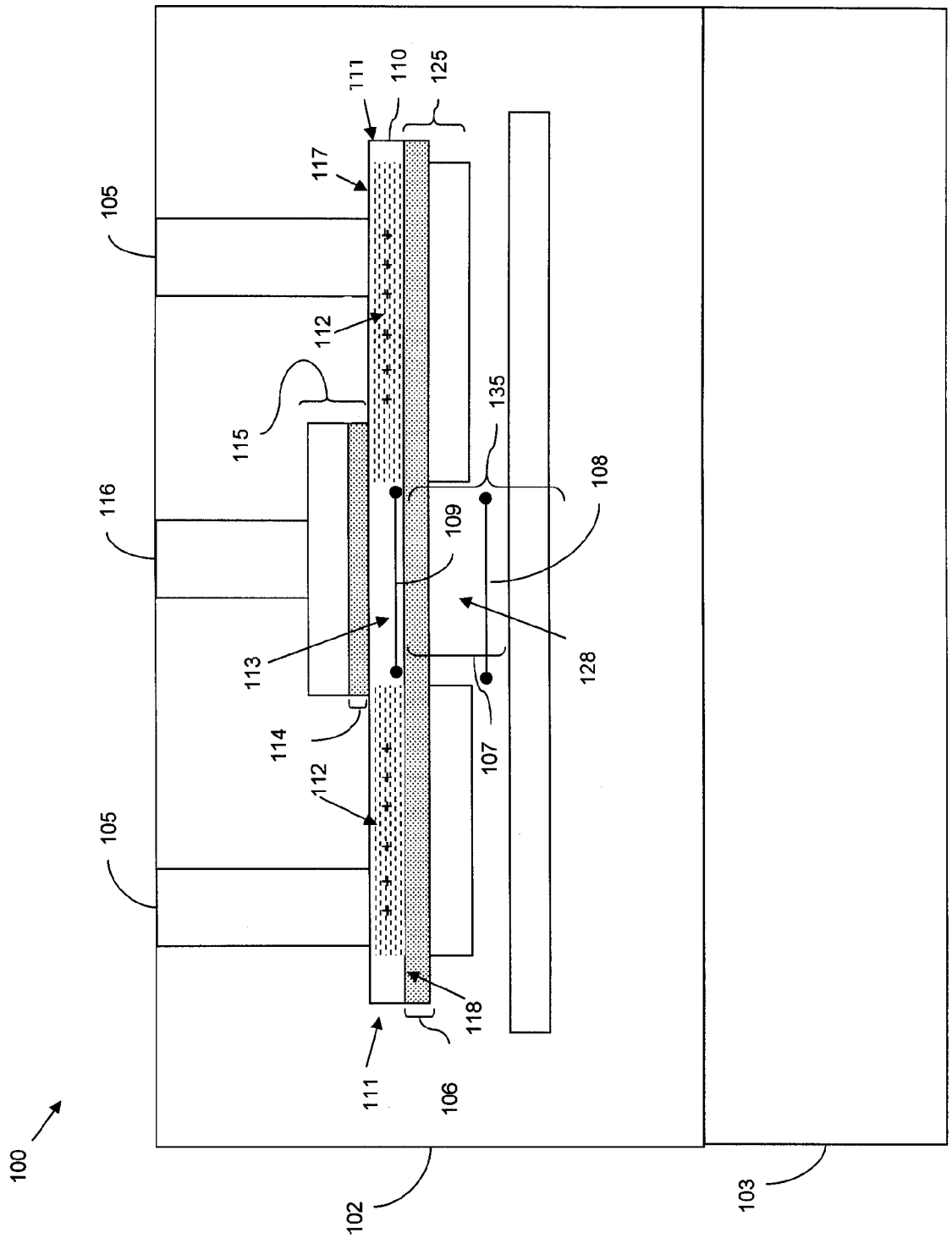
FIG. 1 is schematic cross-sectional view of a CNT transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, the use of carbon nanotube (CNT) devices, such as CNT field effect transistors (CNTFETs), has been proposed to overcome scaling limits encountered by silicon semiconductor devices. Additionally, CNTs exhibit high transconductance, a desirable property for complementary devices (e.g., complementary inverters). Thus, it would be desirable to use CNTs to form complementary CNTFET circuitry which mimics complementary metal oxide semiconductor (CMOS) technology. However, there are two basic barriers to doing so. First, CNTs form intrinsically ambipolar FETs due to the formation of Schottky-Barrier contacts at the junction between the source and drain electrodes and the CNT. Second, since the threshold voltage (Vt) of CNTFETs are intrinsically negative for n-type FETs and positive for p-type FETs, some means is required to adjust the threshold voltages to complementary CNTFETs-compatible values.

A few prior-art methods have been proposed to overcoming this ambipolar property in CNTFETS. One method comprises doping the surface of the source/drain regions of the CNT with organic molecules so that either a p-type or an n-type FET is formed. This method requires additional processing steps during the formation of the FETS and does not allow a user to take advantage of this ambipolar property. Another method comprises introducing source/drain gates over the source/drain regions of the CNT between the source/drain electrodes and the front gate. A preselected voltage applied to the source/drain gates can be used to form electron layers or hole layers in the end regions of the CNT, so as to form an n-type FET or a p-type FET, respectively. However, the size of these source/drain gates is limited due to the limited space between the electrodes and the front gate. Additionally, the position of the source/drain gates above the CNT causes parasitic resistance between the source/drain gates and the source/drain electrodes and also causes parasitic capacitance between the source/drain gates and the front gate. Therefore, it would be advantageous to provide an improved CNTFET, and more particularly, an improved complementary CNT device configured to overcome intrinsic ambipolar properties and to allow for threshold voltage adjustments.

In view of the foregoing, disclosed herein is a carbon nanotube (CNT) technology that overcomes the intrinsic ambipolar properties of CNT field effect transistors (FETs) and optionally, allows for independent threshold adjustments. One embodiment of the invention provides either a stable p-type CNTFET or a stable n-type CNTFET. Another embodiment of the invention provides a complementary CNT device (e.g., a complementary CNT inverter) that incorporates both a stable p-type CNTFET and a stable n-type CNTFET. In order to overcome the ambipolar properties of CNTFETs and to independently adjust threshold voltage of CNTFETs, the structures of the invention use "virtual" source/drain gates together with a back gate in order to describe a fully integrated CNT technology (including a CNTFET and a complementary CNT device). Specifically, two gate layers are introduced above a substrate to form self-aligned virtual source/drain (VSD) gates and a backgate, respectively, for each CNTFET. A CNT is introduced above the two gate layers. Above the CNT, source/drain contacts (i.e., source/drain electrodes) are formed such that they contact the ends of the CNT. Finally, a front gate (i.e., an active gate) is formed between the two electrodes above a channel region in the CNT. In this manner parasitic capacitances and resistances are minimized.

Figure 2:
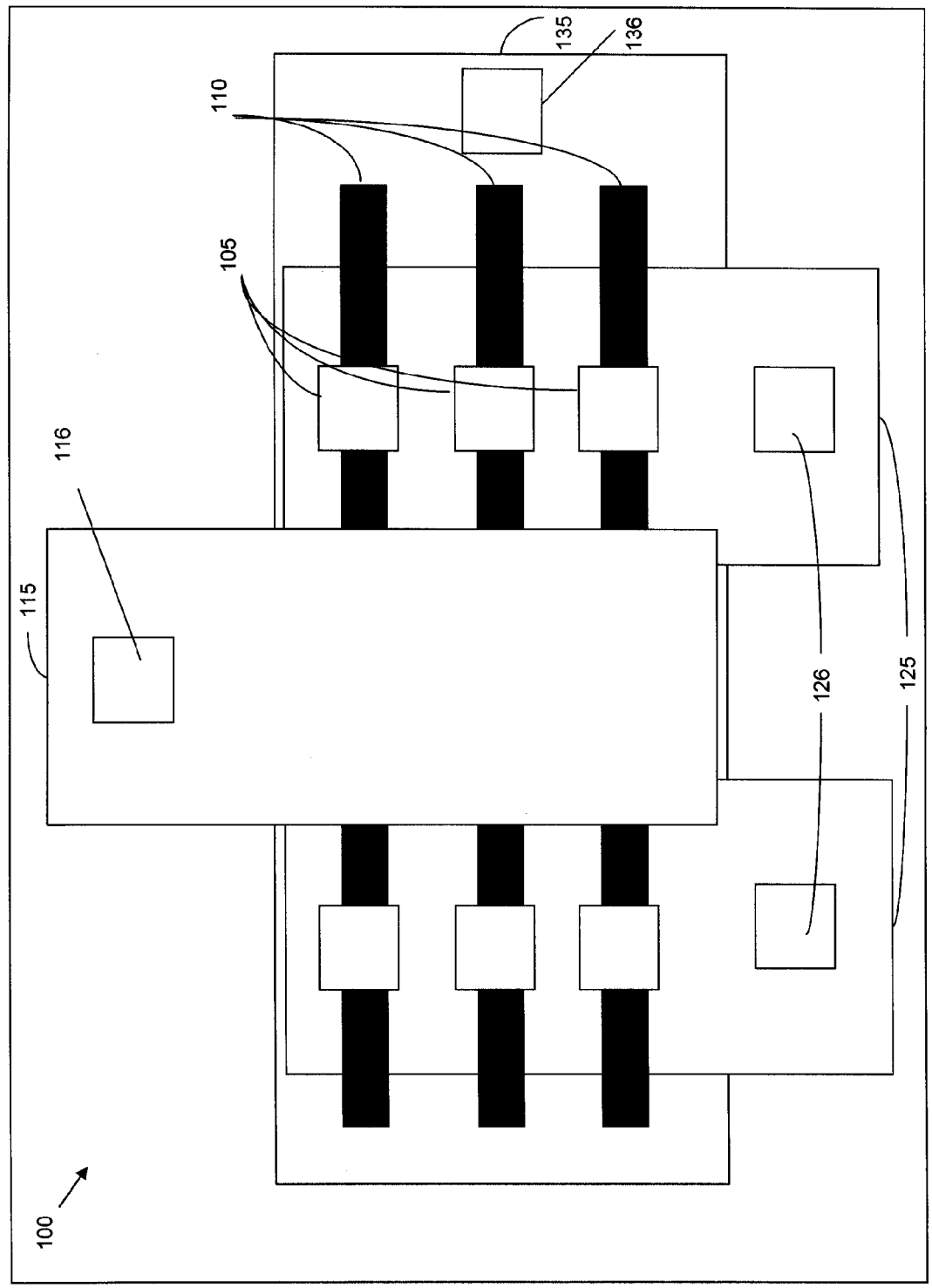
FIG. 2 is a schematic plan view of the CNT transistor of FIG. 1.

More particularly, FIGS. 1 and 2 in combination illustrate an embodiment of a stable n-type CNTFET or p-type CNTFET 100 in an insulating material 102 (e.g., single or multiple layers of an oxide or other dielectric material, including shallow trench isolation structures and/or other isolation structures) above a substrate 103. The CNTFET 100 comprises at least one carbon nanotube 110 (CNT) having a first side 117, a second side 118 and opposing ends 111. For illustration purposes, embodiments of the CNTFET are described herein using a single CNT. However, it is anticipated and illustrated FIG. 2, that the CNTFET of the invention may incorporate either a single CNT or multiple CNTs 110. Specifically, the CNT 110 has a central channel region 113 and source/drain electrodes 105 on either side of the channel region 113 (i.e., at the opposing ends 111). The source/drain electrodes 105 contact the first side 117 of the CNT 110 at the opposing ends 111. The CNTFET structure 100 further comprises a first gate 115 (i.e., a front gate) for imparting a potential to the channel region 113 of the CNT 110 to turn the CNTFET 100 on or off, second gates 125 (i.e., source/drain gates) for imparting a preselected Fermi potential to the opposing ends 110 of the CNT 110 to configure the CNTFET 100 as either a p-FET or an n-FET, and optionally, a third gate 135 (i.e., a back gate) for imparting a preselected potential to the channel region 113 of the CNT 110 to adjust the threshold voltage of the CNTFET 100. Each gate (i.e., the first gate 115, the second gates 125 and the third gate 135) comprises a gate conductor (e.g., a doped polysilicon, tungsten silicide, or any other suitable conductive material) on a gate dielectric (e.g., silicon dioxide or any other suitable dielectric material) adjacent to the CNT 110. The gate conductors and gate dielectrics for the different gates may comprise the same or different conductive and dielectric materials. Each gate can further comprise a gate contact (e.g., first gate contact 116, second gate contacts 126, and third gate contact 136) through which a voltage may be supplied to the corresponding gate.

The first gate 115 is positioned on the first side 117 of the CNT 110 above the channel region 113 and between the source/drain electrodes 105.

The second gates 125 are positioned on the second side 118 of the CNT 110 opposite the source/drain electrodes 105. Specifically, second gates 125 are positioned at each end 111 of the CNT 110. As mentioned above, the second gates 125 are for setting (i.e., adjusting) the Fermi level of the end regions 111 of the CNT 110 to either the valence or the conduction band in order to configure the CNTFET 100 as either a p-FET or an n-FET, respectively. For example, a negative bias (i.e., a negative voltage) applied to second gates 125 can promote a large population of holes within the CNT 110 by forcing the Fermi level to the valence band below the source/drain electrodes (i.e., by forcing a dominance of holes at the opposing ends of the CNT). The resulting structure acts as a p-FET. Alternatively, as illustrated in FIG. 1, a positive bias (i.e., a positive voltage) applied to the second gates 125 can promote a large population of electrons within the CNT by forcing the Fermi level to the conduction band below the source/drain electrodes (i.e., by forcing a dominance of electrons at the opposing ends of the CNT). The resulting structure acts as an n-FET. The second gates 125 are formed such that there is a gap 128 (i.e., a dielectric filled space) between the two second gates 125 below the CNT 110. The gap 128 between the two source/drain gates 125 defines the area of the CNT 110 that is not acted upon by the second gates 125 and, thus, the size 108 of this gap 128 defines the channel region 113 of the CNTFET 110. Additionally, the first gate 115 and second gates 125 can overlap to some degree (e.g., the first gate 115 can be aligned above the gap 128 and extend over a portion of the second gates 125) so as to optimize conduction in the carbon nanotube 110. Furthermore, the relative positioning of the first gate 115 on the first side 117 of the CNT 110 and the second gates 125 on the second side 118 of the CNT 110 minimizes parasitic capacitance between the second gates 125 and the first gate 115 and also avoids parasitic resistance between the second gates 125 and the source/drain electrodes 105.

Optionally, a third gate 135 can be positioned on the second side 118 of the CNT 110 below the channel region 113. As mentioned above, an additional preselected voltage applied to the third gate 135 can be used to impart a preselected potential to the channel region 113 of the CNT 110 in order to independently adjust the threshold voltage of the CNTFET 100. The third gate 135 can be positioned closer to the CNT 110 than the second gates 125 to the extent that it does not obscure the effect of the second gates 125 on the CNT 110. The third gate 135 can also be positioned in the gap 128 between the two second gates 125 such that it is the same distance from the CNT 110 as the second gates 125. However, drive current of the CNTFET 100 can be optimized by positioning the third gate 135 below the gap 128 such the gate dielectric of the third gate (i.e., the back gate dielectric 107) is thicker than the gate dielectrics 114 and 106 of the first 115 and second 125 gates, respectively. If the third gate 135 is below the gap 128, then the size 108 of the gap 128 further defines the area 109 of the carbon nanotube 110 upon which the third gate 135 can act (i.e., the area 109 to which a preselected potential can be imparted to adjust threshold voltage).

Figure 3:
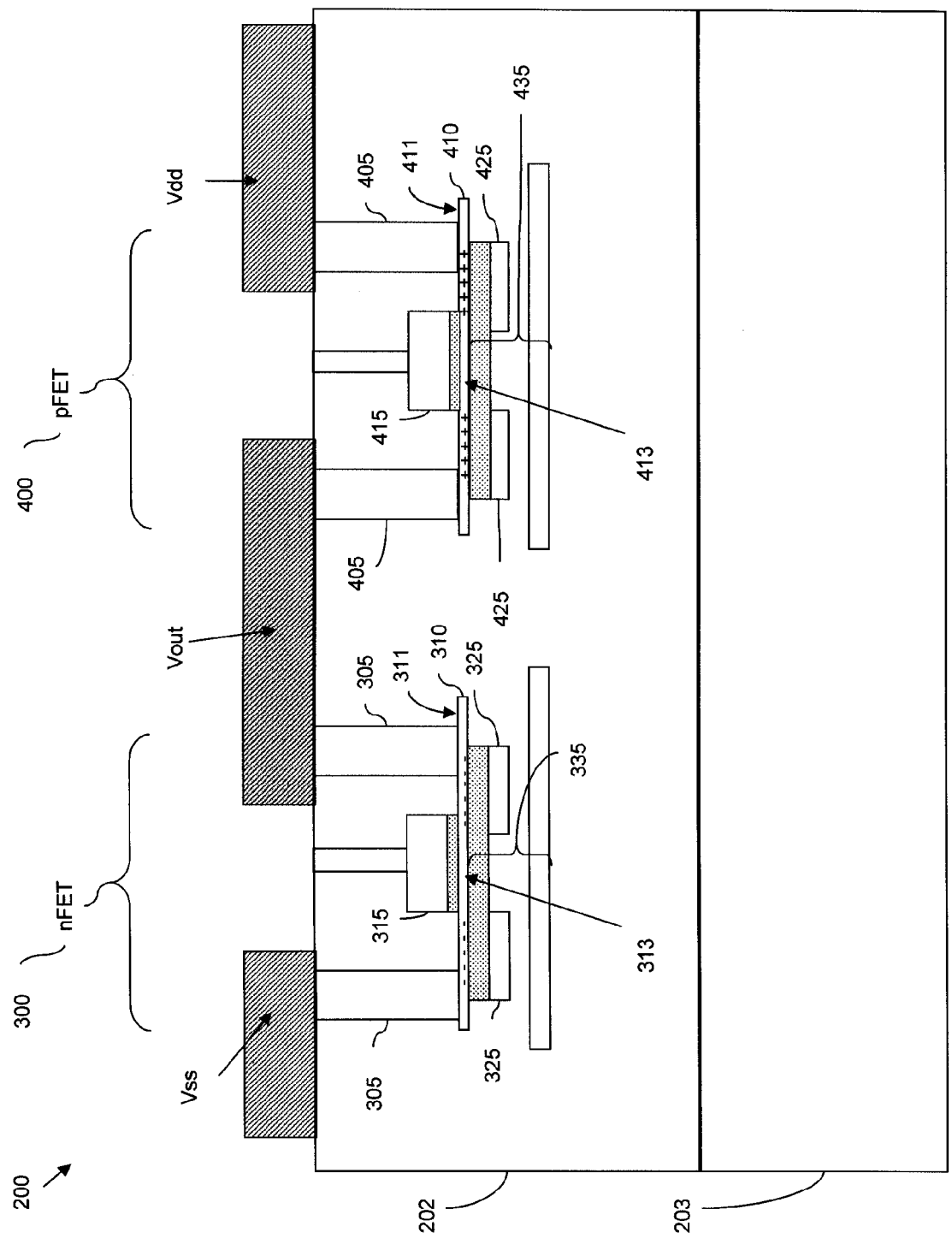
FIG. 3 is a schematic cross-sectional view of a complementary CNT device.
Figure 4:
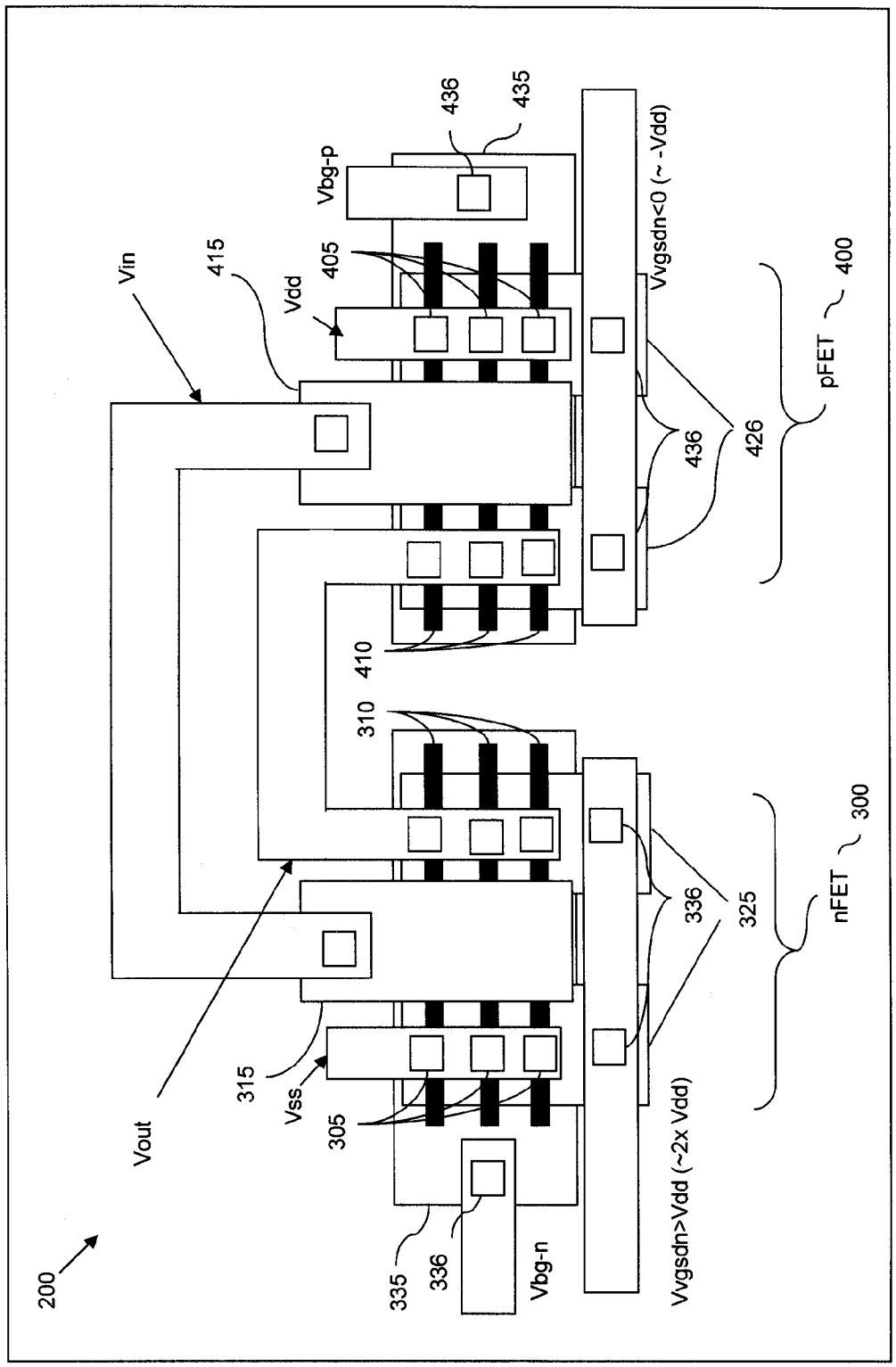
FIG. 4 is a schematic plan view of the complementary CNT device of FIG. 2.

FIGS. 3 and 4 in combination illustrate an embodiment of a complementary CNT device 200 (e.g., a complementary inverter) that incorporates both a stable p-type CNTFET 400 and a stable n-type CNTFET 300, as described above, in an insulating material 202 (e.g., an oxide) above a substrate 203. More particularly, the complementary CNT device 200 comprises two adjacent transistors (i.e., a first transistor 300 and a second transistor 400). The first and second transistors 300 and 400 each comprise at least one carbon nanotube 310, 410 (as described above), source/drain electrodes 305, 405 (as described above), a first gate 315, 415 (as described above), second gates 325, 425 (as described above) and optionally, a third gate 335, 435 (as described above). As with the CNTFET 100 of the invention, for illustration purposes, embodiments of the complementary CNT device 200 of the invention are describe using a single CNT 310, 410 in each of the first and second transistors 300, 400. However, it is anticipated and illustrated in FIG. 4, that the invention may incorporate either a single CNT 310, 410 or multiple CNTs 310, 410 in each of the first and second transistors 300, 400. Adjacent transistors (i.e., the first and second transistors 300, 400) can be incorporated into a complementary CNT device 200 (e.g., a complementary CNT inverter) by adjusting the Fermi levels within the CNTs of adjacent transistors so as to configure one of the transistors as an n-type CNTFET 300 and the other as a p-type CNTFET 400. Specifically, a positive voltage applied to the second gates 325 forces the Fermi level of the opposing ends 311 of the first transistor 300 to the conduction band and, thereby, configures the first transistor 300 as a stable n-type transistor (see detailed discussion above). A negative voltage applied to the second gates 425 forces the Fermi level of the opposing ends 411 of the second transistor 400 to the valence band and, thereby, configures the second transistor as a stable p-type transistor (see detailed discussion above). Additionally, if third gates 335, 435 are positioned below the channel region 313, 413 of both of the first and second transistors 300, 400 (e.g., as described above), the third gates 335, 435 may be used to independently adjust the threshold voltages of the n-type and p-type CNTFETs 300, 400, respectively, within the complementary CNT device 200. Specifically, additional preselected voltages applied to the third gates 335, 435 can be used to impart preselected potentials to the channel regions of the CNTs so as to independently adjust the threshold voltages of the CNTFETs.

Figure 5:
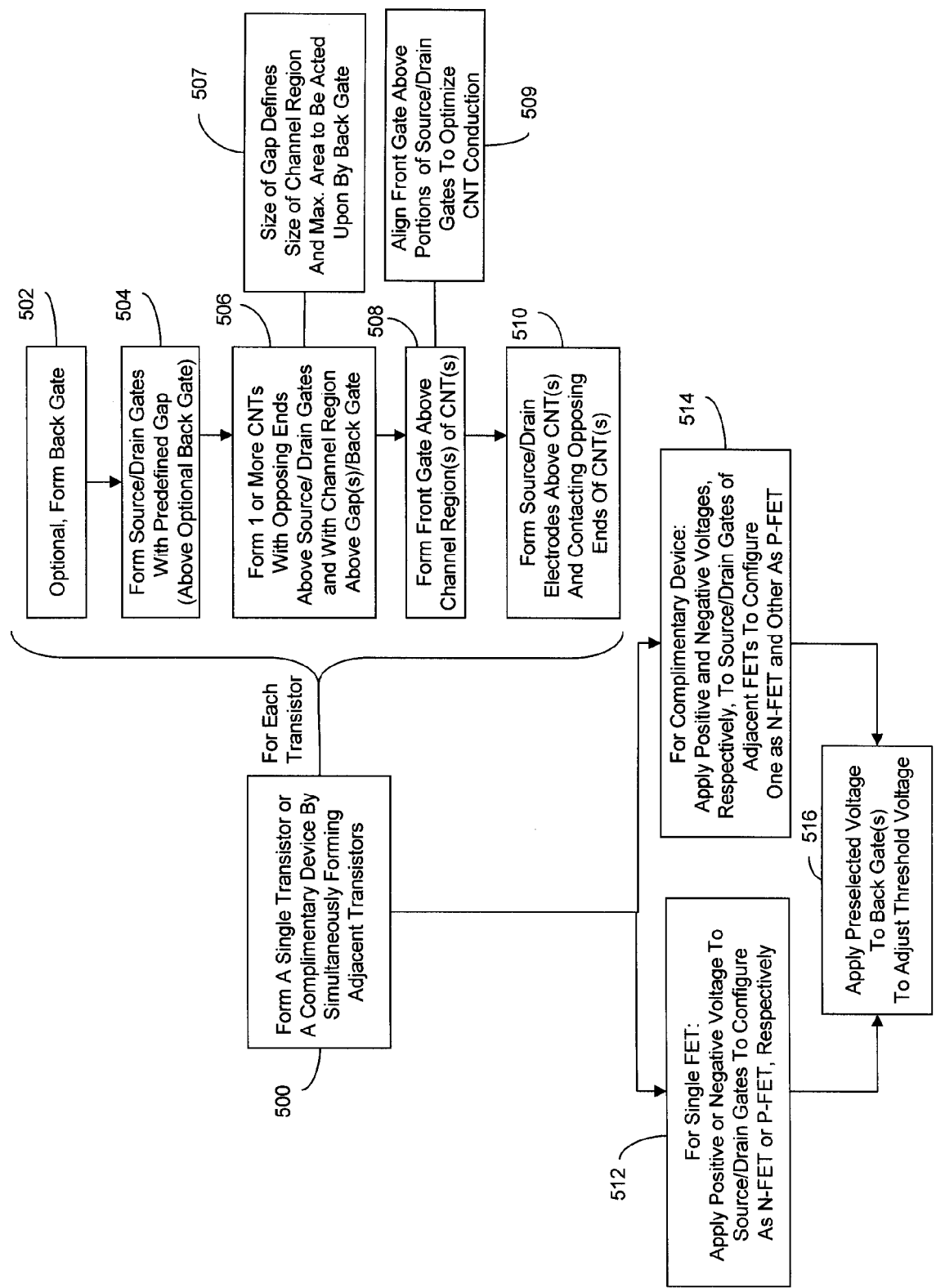
FIG. 5 is a schematic flow diagram illustrating embodiments of the method of forming the structures of FIG. 1 and FIG. 2.

FIG. 5 illustrates a method of forming the p-type and n-type CNTFET structures 100 of FIGS. 1 and 2 and the complementary CNT device structure 200 of FIGS. 3 and 4. More particularly, the following method steps provide for the formation of either a single CNTFET 100 (p-type or n-type) or a complementary CNT device 200 (with both a p-type 400 and an n-type 300 CNTFET).

The method comprises forming at least one transistor such that each transistor (e.g., a single transistor or multiple adjacent transistors) is formed with a front gate, source/drain gates, and optionally, a back gate (500). The front gate is formed (at process 508) so that a potential can be imparted to the channel region of the CNT in order to turn the CNTFET on or off. The source/drain gates are formed (at process 504 discussed below) so that a preselected bias (e.g., a preselected positive or negative voltage) applied to the source/drain gates can force the Fermi level of the opposing ends of the CNT to the valence or the conduction band, in order to configure the CNTFET as either a p-FET or an n-FET, respectively (at process 512 or 514). The back gate is optionally formed (at process 502) so that an additional preselected voltage applied to the back gate can impart a preselected potential on the channel region in order to independently adjust the threshold voltage of the CNTFET (at process 516, see detailed discussion below). Each of the gate structures (i.e., the front gate, the source/drain gates and the back gate) are formed using conventional methods such that they each comprise a corresponding gate conductor (e.g., a doped polysilicon, tungsten silicide, or any other suitable conductive material) on a corresponding gate dielectric (e.g., silicon dioxide or any other suitable dielectric material) adjacent to the CNT.

More particularly, at least one transistor is formed by optionally forming a back gate structure (e.g., on an insulator layer above a substrate) (502). Source/drain gates are preferably formed above the back gate and separated by a gap such that the back gate is aligned below the gap (504). A carbon nanotube, having opposing ends and a channel region, is formed such that the source/drain gates are aligned below the opposing ends and such that the gap (and thus, the back gate) is below the channel region (506). Those skilled in the art will recognize that by forming the source/drain gates above the back gate, the back gate dielectric between the back gate and the carbon nanotube can be formed thicker than the source/drain gate dielectric between the second gates and the carbon nanotube in order to optimize drive current. Source/drain electrodes are formed above the carbon nanotube such that they contact the opposing ends opposite the source/drain gates (510). A front gate is also formed above the CNT (508). Specifically, the front gate is formed above the channel region between the source/drain electrodes. By aligning the front gate above the gap and extending the front gate over a portion of each of the source/drain gates conduction in the carbon nanotube can be optimized (509). The at least one transistor can be configured into either a p-FET or an n-FET by applying a negative voltage or positive voltage, respectively, to the source/drain electrodes (512). If at least two adjacent transistors are formed, those transistors can be incorporated into a complementary CNT inverter by configuring one of the two adjacent transistors as a stable p-type transistor and another of said two adjacent transistors as a stable n-type transistor (514). Once a single CNTFET is formed (at process 512) or a complementary CNT device with multiple CNTFETs is formed (at process 514), an additional preselected voltage can be applied to the back gate(s) to independently adjust the threshold voltage of each CNTFET (516). In particular, the back gate voltage may be adjusted so that the potential of the channel region results in very few free electrons or holes when the front gate voltage is the same as the source voltage, but results in a large number of electrons when the front gate voltage, with respect to its source voltage, is above (a positive-valued) threshold voltage for n-type CNTFETs, or a large number of holes when the front gate voltage, with respect to its source voltage, is below (a negative-valued) threshold voltage for p-type CNTFETs. For complementary CNTFET operation the absolute values of the threshold voltages of the p-type and n-type CNTFETs are each less than the power-supply voltage used to operate the complementary CNTFET circuitry, with the p-type threshold voltage less than zero and the n-type threshold voltage greater than zero.

Therefore, disclosed above is a CNT technology that overcomes the intrinsic ambipolar properties of CNTFETs and optionally, allows for independent threshold adjustments. One embodiment of the invention provides either a stable p-type CNTFET or a stable n-type CNTFET. Another embodiment of the invention provides a complementary CNT device. In order to overcome the ambipolar properties of in a CNTFET, source/drain gates are introduced below the CNT opposite the source/drain electrodes. The source/drain gates are used to position the Fermi level of the ends of the CNT to the conduction or valence bands so as to configure the FET as either an n-type or p-type CNTFET, respectively. Two adjacent FETs, configured such that one is an n-type CNTFET and the other is a p-type CNTFET, can be incorporated into a complementary CNT device. In order to independently adjust the threshold voltage of an individual CNTFET, a back gate can also be introduced below the CNT and, particularly, below the channel region of the CNT opposite the front gate. These CNTFETS exhibit minimized parasitic capacitances and resistances and, thus, can be incorporated into very high density complementary circuits which use very little power and provide very high speed. Additionally, improved circuit yield follows from the ability to adjust the threshold voltages of the CNTFETs in response to process, environment, or other variables. Lastly, the fabrication costs associated with the CNTFETS of the invention are lower than those associated with prior art technology due to the elimination of the steps that would otherwise be associated with doping of source and drain regions and from the increased circuit densities achievable The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A carbon nanotube field effect transistor comprising:
   a semiconductor substrate;
   at least one carbon nanotube above said substrate, said carbon nanotube having a first side, a second side opposite said first side and opposing ends, and comprising a channel region between said opposing ends;
   source/drain electrodes contacting said opposing ends on said first side without extending laterally beyond said opposing ends;
   a first gate on said first side above said channel region, said first gate being positioned laterally between said source/drain electrodes such that no portion of said first gate overlaps said source/drain electrodes, wherein said first gate is adapted to impart a first potential on said channel region so as to turn on said carbon nanotube field effect transistor; and
   second gates between said second side and said substrate, said second gates being positioned adjacent to said opposing ends opposite said source/drain electrodes,
      wherein said second gates are adapted to impart a second potential on said opposing ends so as to configure said carbon nanotube field effect transistor as one of a p-type transistor and an n-type transistor, and
      wherein relative positions of said first gate and said source/drain electrodes on said first side and said second gates on said second side minimizes parasitic capacitance between said second gates and said first gate and avoids parasitic resistance between said second gates and said source/drain electrodes.

2. The carbon nanotube field effect transistor of claim 1, further comprising a gap between said second gates that defines a size of said channel region in said carbon nanotube.

3. The carbon nanotube field effect transistor of claim 1, further comprising a gap between said second gates, wherein said first gate is aligned above said gap and overlaps above said second gates without overlapping said source/drain electrodes so as to optimize conduction in said carbon nanotube.

4. A carbon nanotube field effect transistor comprising:
   a semiconductor substrate;
   at least one carbon nanotube above said substrate, said carbon nanotube having a first side, a second side opposite said first side and opposing ends and comprising a channel region between said opposing ends;
   source/drain electrodes contacting said opposing ends on said first side without extending laterally beyond said opposing ends;
   a first gate on said first side above said channel region, said first gate being positioned laterally between said source/drain electrodes such that no portion of said first gate overlaps said source/drain electrodes, wherein said first gate is adapted to impart a first potential on said channel region so as to turn on said carbon nanotube field effect transistor;
   second gates between said second side and said substrate, said second gates being positioned adjacent to said opposing ends opposite said source/drain electrodes;
   a third gate between said second side and said substrate, said third gate being positioned below said channel region opposite said first gate and further being electrically isolated from said substrate,
      wherein said first gate, said second gates and said third gates each comprise a doped polysilicon gate conductor,
      wherein said second gates are adapted to impart a second potential on said opposing ends so as to configure said carbon nanotube field effect transistor as one of a p-type transistor and an n-type transistor,
      wherein said third gate is adapted to impart a third potential on said channel region in order to independently adjust a threshold voltage of said carbon nanotube field effect transistor, and
      wherein relative positions of said first gate and said source/drain electrodes on said first side and said second gates on said second side minimizes parasitic capacitance between said second gates and said first gate and avoids parasitic resistance between said second gates and said source/drain electrodes.

5. The carbon nanotube field effect transistor of claim 4, further comprising a gap between said second gates that defines a size of said channel region in said carbon nanotube.

6. The carbon nanotube transistor of claim 5, wherein said third gate is aligned below said gap such that said third gate is farther from said carbon nanotube than said second gates.

7. The carbon nanotube field effect transistor of claim 4, wherein said first gate, said second gates and said third gate each comprise a gate dielectric and a doped polysilicon gate conductor, wherein said gate dielectric of said third gate is thicker than said gate dielectric of said first gate and said second gates so as to optimize drive current.

8. The carbon nanotube field effect transistor of claim 4, further comprising a gap between said second gates, wherein said first gate is aligned above said gap and overlaps above said second gates without overlapping said source/drain electrodes so as to optimize conduction in said carbon nanotube.

9. The carbon nanotube field effect transistor of claim 4, said third gate being one of positioned within a gap between said second gates a same distance from said carbon nanotube as said second gates and positioned above said gap closer to said carbon nanotube than said second gates.

10. The complementary carbon nanotube device of claim 4, said first gate, said second gates and said third gate comprising different dielectric materials.

11. A complementary carbon nanotube device comprising:
a semiconductor substrate;
a first field effect transistor on said semiconductor substrate; and
a second field effect transistor and said semiconductor substrate and electrically connected to said first field effect transistor, wherein said first field effect transistor and said second field effect transistor each comprise:
at least one carbon nanotube having a first side, a second side opposite said first side and opposing ends and comprising a channel region between said opposing ends;
source/drain electrodes contacting said opposing ends on said first side without extending laterally beyond said opposing ends;
a first gate on said first side above said channel region, said first gate being positioned laterally between said source/drain electrodes such that no portion of said first gate overlaps said source/drain electrodes, wherein said first gate is adapted to impart a first potential on said channel region so as to turn on said carbon nanotube field effect transistor; and
second gates between said second side and said substrate, said second gates being positioned adjacent to said opposing ends opposite said source/drain electrodes,
wherein a positive voltage applied to said second gates of said first transistor configures said first field effect transistor as an n-type transistor,
wherein a negative voltage applied to said second gates of said second transistor configures said second field effect transistor as a p-type transistor, and
wherein, for each said first field effect transistor and said second field effect transistor, relative positions of said first gate and said source/drain electrodes on said first side and said second gates on said second side minimizes parasitic capacitance between said second gates and said first gate and avoids parasitic resistance between said second gates and said source/drain electrodes.

12. The complementary carbon nanotube device of claim 11, wherein said first field effect transistor and said second field effect transistor each further comprise a gap between said second gates that defines said channel region in said carbon nanotube.

13. The complementary carbon nanotube device of claim 11, wherein said first field effect transistor and said second field effect transistor each further comprise a gap between said second gates, wherein said first gate is aligned above said gap and overlaps above said second gates without overlapping said source/drain electrodes so as to optimize conduction in said carbon nanotube.

14. The complementary carbon nanotube device of claim 11, further comprising:
at least one insulator layer on said substrate below said first field effect transistor and said second field effect transistor,
wherein said first field effect transistor and said second field effect transistor each comprise a third gate positioned between said second side and said substrate below said channel region, said third gate further being isolated from said substrate and other devices on said substrate by said at least one insulator layer and adapted to allow for independent threshold voltage adjustment and
wherein said first gate, said second gates and said third gate each comprise a doped polysilicon gate conductor.

15. The complementary carbon nanotube device of claim 14, said first gate, said second gates and said third gate comprising different dielectric materials.

16. A method of forming a carbon nanotube device comprising:
forming at least one carbon nanotube field effect transistor, wherein each carbon nanotube field effect transistor is formed by:
forming source/drain gates in an insulator layer above a substrate such that said source/drain gates separated by a gap;
forming a carbon nanotube, having opposing ends and a channel region, over said source/drain gates such that said source/drain gates are aligned below said opposing ends and said gap is below said channel region;
forming a front gate above said channel region; and
forming source/drain electrodes above said opposing ends of said carbon nanotube such that said source/drain electrodes contact said opposing ends, but do not extend laterally beyond said opposing ends and further such that no portion of said first gate overlaps said source/drain electrodes; and
configuring said at least one carbon nanotube field effect transistor as one of a p-type transistor and an n-type transistor by applying one of a negative voltage and a positive voltage, respectively, to said source/drain gates, wherein, due to relative positions of said front gate and said source/drain electrodes above said carbon nanotube and said source/drain gates below said carbon nanotube, parasitic capacitance between said source/drain gates and said front gate is minimized and parasitic resistance between said source/drain gates and said source/drain electrodes is avoided.

17. The method of claim 16, further comprising defining a size of said channel region by defining a size of said gap.

18. The method of claim 16, further comprising:
forming a back gate in said insulator layer above said substrate before said forming of said carbon nanotube such that said back gate will be aligned below said channel region and will be positioned one of below said gap between said second gates, within said gap between said second gates and above said gap between said second gates; and using said back gate to independently adjust a threshold voltage of said at least one carbon nanotube field effect transistor.

19. The method of claim 18, wherein said forming of said source/drain gates further comprises forming said source/drain gates above said back gate such that a back gate dielectric between said back gate and said carbon nanotube is thicker than a source/drain gate dielectric between said second gates and said carbon nanotube so as to optimize drive current.

20. The method of claim 19, said back gate, said source/drain gates and said front gate each being formed so as to comprise a doped polysilicon gate conductor.

21. The method of claim 16, wherein said forming of said front gate further comprises aligning said front gate above said gap and extending said front gate over a portion of each of said source/drain gates without overlapping said source/drain electrodes so as to optimize conduction in said carbon nanotube.

22. The method of claim 16, wherein said forming of said at least one carbon nanotube field effect transistor comprises simultaneously forming two adjacent transistors and wherein said method further comprises forming a complementary carbon nanotube inverter by configuring one of said two adjacent transistors as a p-type transistor and another of said two adjacent transistors as an n-type transistor.

* * * * *